(12) United States Patent
Krumberger (10) Patent No.: US 7,385,170 B1
(45) Date of Patent: Jun. 10, 2008

(54) AMBIENT LIGHT SUPPRESSION CIRCUIT FOR PHOTODIODE RECEIVER APPLICATIONS

(75) Inventor: Michael Edward Krumberger, Pocatello, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 542 days.

(21) Appl. No.: 10/925,263

(22) Filed: Aug. 24, 2004

(51) Int. Cl.
  *H03F 3/45* (2006.01)
  *H03F 1/34* (2006.01)
(52) U.S. Cl. .............................. 250/214 A; 250/214 B; 330/291; 330/308
(58) Field of Classification Search ......... 250/214 AL, 250/214 B, 214 C, 214 A; 330/288, 291, 330/293, 294, 308, 59
  See application file for complete search history.

(56) References Cited

U.S. PATENT DOCUMENTS

| | | | | |
|---|---|---|---|---|
| 4,492,931 A | * | 1/1985 | Deweck ....................... | 330/294 |
| 5,473,461 A | * | 12/1995 | Miremadi .................... | 398/202 |
| 5,532,471 A | | 7/1996 | Khorramabadi et al. .... | 250/214 |
| 5,714,909 A | | 2/1998 | Jackson ....................... | 330/308 |
| 5,793,230 A | * | 8/1998 | Chu et al. .................... | 327/77 |
| 5,880,827 A | * | 3/1999 | Heinke ........................ | 356/224 |
| 5,982,232 A | * | 11/1999 | Rogers ........................ | 330/69 |
| 6,124,691 A | * | 9/2000 | Teder .......................... | 318/483 |
| 6,137,101 A | | 10/2000 | Yokogawa et al. ......... | 250/214 |
| 6,307,196 B1 | * | 10/2001 | Thompson et al. ..... | 250/214 A |
| 6,359,715 B1 | | 3/2002 | Imajo .......................... | 359/189 |
| 6,614,312 B1 | * | 9/2003 | Fowler ........................ | 330/308 |
| 2007/0090276 A1 | * | 4/2007 | Peng et al. .............. | 250/214.1 |

* cited by examiner

*Primary Examiner*—John R Lee
(74) *Attorney, Agent, or Firm*—Workman Nydegger (57) ABSTRACT

An optical receiver circuit that effectively suppresses ambient light. A photodiode receives both desired higher frequency modulated optical signals, as well as the lower frequency or even DC ambient light optical signals. The optical receiver circuit includes a trans-impedance amplifier as do conventional optical receiver circuits. However, the optical receiver circuit also includes an ambient light suppression circuit in a feedback loop between the output terminal of the trans-impedance amplifier and the input terminal of the trans-impedance amplifier. The transfer function of the ambient light suppression circuit may be selected such that the transfer function of the optical receiver circuit filters out DC and lower frequency components contributed by the unwanted ambient light, and passes the higher frequency components that correspond to the wanted optical signal that actually contains the information of interest.

16 Claims, 10 Drawing Sheets

AMBIENT LIGHT SUPPRESSION CIRCUIT FOR PHOTODIODE RECEIVER APPLICATIONS

BACKGROUND OF THE INVENTION

1. The Field of the Invention

The present invention relates generally to analog circuitry. More specifically, the present application relates to circuitry and methods for performing ambient light suppression in a photodiode receiver application.

2. Background and Relevant Art

Optical systems are used for a wide-variety of applications in order to communicate information and detect environmental conditions. Optical systems typically include a transmitter that sends out a modulated optical signal, and a receiver that may receive at least a distorted version of the modulated optical signal.

In one application, optical system may be used to detect the presence of an object in a given volume. The transmitter transmits the modulated optical signal into the given volume. If an object is present in the volume, a portion of the optical signal is reflected back into the receiver. The receiver may thus detect, based on the reflected light, whether there is an object in the volume. Conventional obstacle detection mechanisms often employ this technology. If an obstacle is introduced into the path of the optical signal, an attenuate form of the signal is reflected to a photodiode receiver. The receiver then processes the received signal allowing the system to detect the obstacle and effect some appropriate control.

As previously mentioned, optical systems are used to detect the presence of an object in a given volume. In many cases, the volume under examination is not only subject to the modulated optical signal, but is also exposed to ambient light optical signals. The ambient light optical signals include Direct Current (DC) components. In addition, the ambient light optical signals also include relatively low frequency components compared to the higher frequencies of the modulated optical signal. The ambient light optical signals received by the photodiode receiver can cause a false positive detection of an object within the volume, thereby frustrating the purpose of the object detection mechanism.

Therefore, what would be advantageous are photodiode receiver circuits that effectively suppress ambient light while allowing higher frequency modulated optical signals to be detected.

BRIEF SUMMARY OF THE INVENTION

The foregoing problems with the prior state of the art are overcome by the principles of the present invention which are directed towards an optical receiver circuit that effectively suppresses ambient light, which often has intensities which are relatively constant and/or have relatively low intensity variance frequencies. A photodiode receives both desired higher frequency modulated optical signals, as well as the lower frequency or even DC ambient light optical signals. Accordingly, the photodiode may generate a current that likewise may include current components that result from both the ambient light as well as the higher frequency modulated light that includes the information of interest.

The optical receiver circuit includes a trans-impedance amplifier as do conventional optical receiver circuits. However, the optical receiver circuit also includes an ambient light suppression circuit in a feedback loop between the output terminal of the trans-impedance amplifier and the input terminal of the trans-impedance amplifier. The transfer function of the ambient light suppression circuit may be selected such that the transfer function of the optical receiver circuit as a whole filters out DC and lower frequency components contributed by the unwanted ambient light, and passes the higher frequency components that correspond to the wanted optical signal that actually contains the information of interest.

The ambient light suppression circuit may be a first-order filter that allows the optical receiver circuit to behave as a first-order high pass filter. In this configuration, the ambient light suppression circuit may be an integrating amplifier. The ambient light suppression circuit may even be higher-order thereby allowing for the optical receiver circuit to be designed as a high-pass filter with steeper-offs from the cutoff frequency moving down the frequency spectrum. This permits for the filtering out of a wider range of low frequency components as might be present in the undesired ambient light. Whether the optical receiver circuit operates as a first-order or higher order high pass filter, the function and stability of the optical receiver may be tested even before the optical receiver circuit is fabricated within an integrated circuit.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to a photodiode receiver that has an ambient light suppression circuit that allows the receiver as a whole to reject more ambient light while allowing the higher frequency modulated signal of interest to pass. In some embodiments, the receiver not only rejects DC light, but also rejects low frequency optical signals thereby potentially improving ambient light rejection. Furthermore, the ambient light suppression circuit may be designed so that the receiver as a whole has a relatively predicable frequency response that has high stability.

Figure 1:
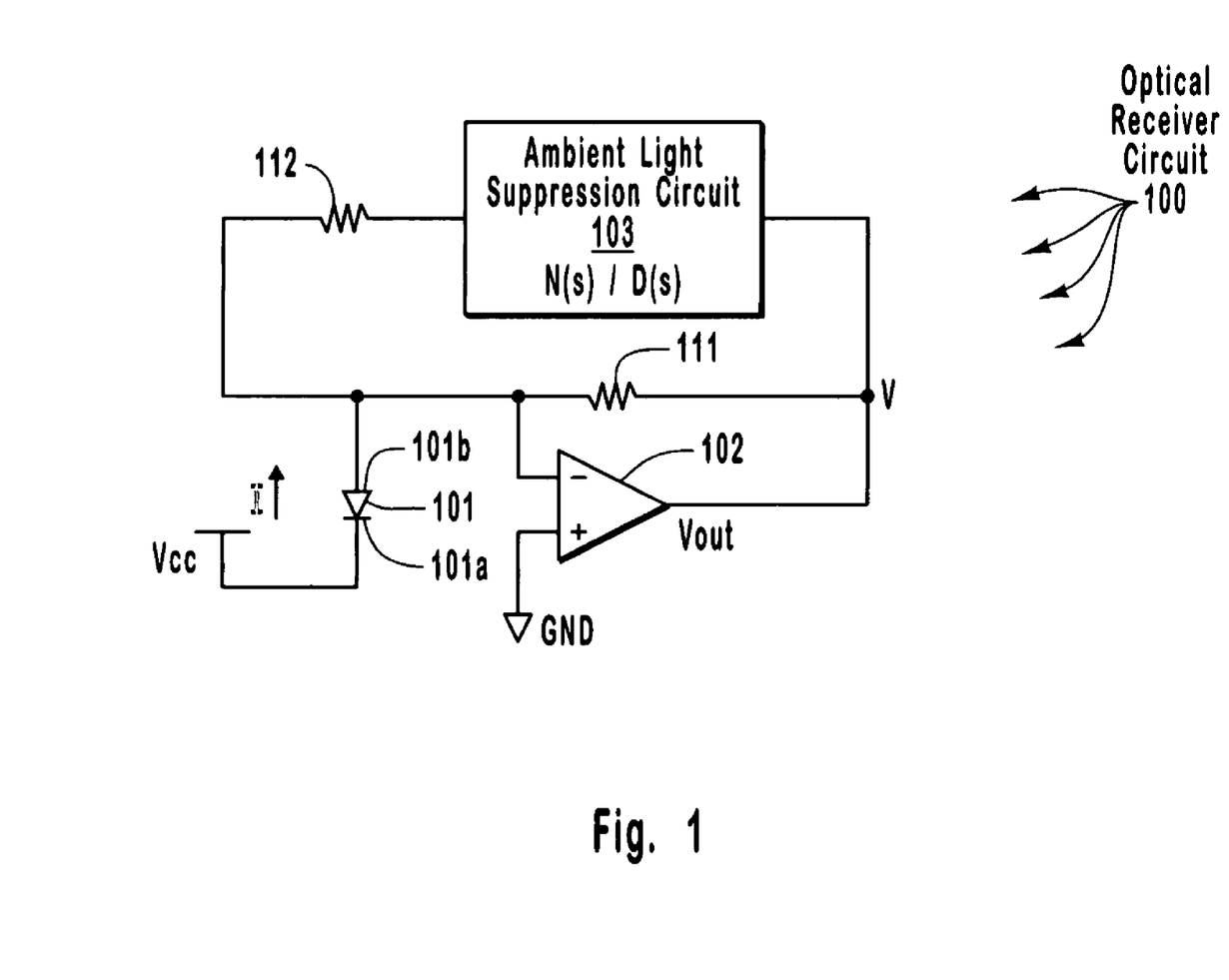
FIG. 1 illustrates a general circuit diagram of an optical receiver circuit that includes an ambient light suppression circuit in accordance with the principles of the present invention.

FIG. 1 illustrates an optical receiver circuit 100 in accordance with the principles of the present invention. The optical receiver circuit 100 includes a photodiode 101, a trans-impedance amplifier 102 and an ambient light suppression circuit 103, each configured as shown.

The photodiode 101 generates a current (represented by "I") flowing from its cathode terminal 101a to its anode 101b when exposed to light. The current (I) has a magnitude at any given instant in time that approximates the intensity of the absorbed light. Accordingly, the electrical current (I) generated by the photodiode 101 has approximately the same frequency characteristics as did the light absorbed by the photodiode 101. Therefore, the photodiode 101 converts optical signals to electrical signals having approximately the same frequency spectrum for the frequencies of interest.

The trans-impedance amplifier 102 converts differential currents detected at its input terminals to a voltage Vout on its outpout terminal. One input terminal of the trans-impedance amplifier 102 is coupled to either the cathode terminal 101a or the anode terminal 101b of the photodiode. In the illustrated embodiment of FIG. 1, the negative input terminal of the trans-impedance amplifier 102 is coupled to the anode terminal 101b of the photodiode, while the positive input terminal of the trans-impedance amplifier 102 is at a roughly fixed voltage GND. The cathode terminal 101a of the photodiode is coupled to a high voltage reference such a Vcc.

The optical receiver circuit 100 includes two parallel feedback paths between the output terminal of the trans-impedance amplifier 102 and the input terminal of the trans-impedance amplifier 102. One is through resistor 111 and one is through the parallel combination of the ambient light suppression circuit 103 and resistor 112.

During operation, the photodiode 101 generates currents (I) that have the same frequency characteristics as the optical signal received by the photodiode 101. For DC and low frequency currents such as those generated by ambient light, the ambient light suppression circuit 103 absorbs more of the current. For higher frequency currents such as those generated by reflected light modulated by the transmitter, the ambient light suppression circuit 103 has trivial effect, and thus the current (I) flows into the trans-impedance amplifier 102 where the current is converted into a voltage equal to the product of the feedback resistor 111 and the current (I).

In the illustration, the ambient light suppression circuit 103 is represented as having the general frequency domain transfer function N(s)/D(s), wherein N(s) represents the numerator of the transfer function, and D(s) represents the denominator of the transfer function. In the illustrated receiver configuration of FIG. 1, the optical receiver circuit 100 as a whole would then have a transfer function approximated in its first order by the following Equation 1:

$$\text{Magnitude}(V/I) = Rf*D(s)/[Rf/Rx*N(s)+D(s)] \quad (1)$$

where,

V is the voltage generated by the trans-impedance amplifier 102,

I is the current differential received by the trans-impedance amplifier 102,

Rf is the resistance of resistor 111, and

Rx is the resistance of resistor 112.

The numerator (Rf*D(s)) of the receiver transfer function is selected to provide transmission zeros at DC and/or low frequency. In order to block DC at least one of the zeros of the transfer function should be at DC. However, all of the zeros may be at DC although other solutions are possible within the scope of the present invention. Pole locations may be selected as high as possible without attenuating the signal of interest. The resulting receiver acts as a high pass filter that filters out signals generated by unwanted ambient light, while passing signals generated by the modulated light transmitted by the transmitter. This design procedure will become clearer from specific examples provided further below.

Figure 2A:
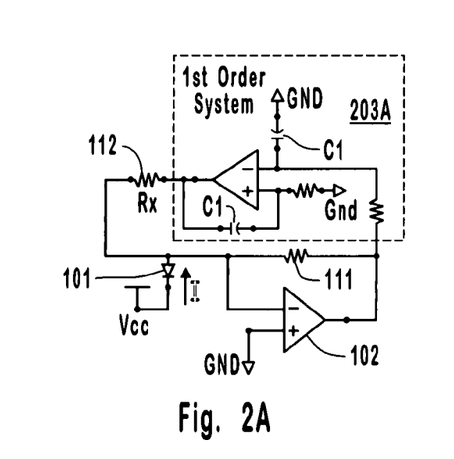
FIG. 2A illustrates an example of the optical receiver circuit of FIG. 1 in which the ambient light suppression circuit is a first-order filter.
Figure 2B:
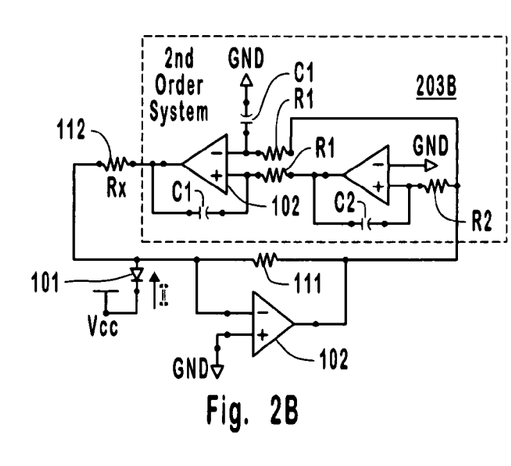
FIG. 2B illustrates an example of the optical receiver circuit of FIG. 1 in which the ambient light suppression circuit is a second-order filter.
Figure 2C:
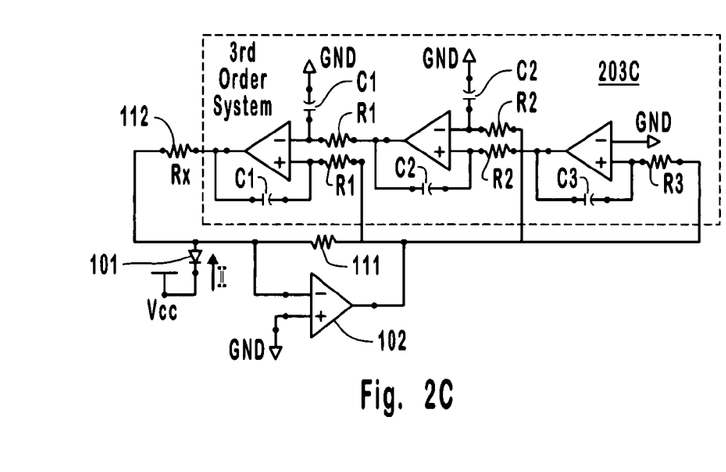
FIG. 2C illustrates an example of the optical receiver circuit of FIG. 1 in which the ambient light suppression circuit is a third-order filter.

FIGS. 2A, 2B, and 2C illustrate an embodiment of the optical receiver circuit 100 in which the ambient light suppression circuit is a first-order ambient light suppression circuit 203A (see FIG. 2A), a second-order ambient light suppression circuit 203B (see FIG. 2B), and a third-order ambient light suppression circuit 203C (see FIG. 2C), respectively.

The transfer function N(s)/D(s) of the first-order ambient light suppression circuit 203A is defined by Equation 2 as follows:

$$N(s)/D(s) = 1/(RCs) \quad (2)$$

where,

R is the resistance of all resistors in the suppression circuit.

In this case, the transfer function Rf*D(s)/[Rf/Rx*N(s)+D(s)] of the first-order receiver is defined in Equation 3 as follows:

$$\text{Magnitude}(V/I) = (Rf*s)/[s+Rf/(Rx*R*C)] \quad (3)$$

The transfer function N(s)/D(s) of the second-order ambient light suppression circuit 203B is defined by Equation 4 as follows:

$$N(s)/D(s) = (R1*C1*s+1)(R1*R2*C1*C2*s+2) \quad (4)$$

In this case, the transfer function $Rf*D(s)/[Rf/Rx*N(s)+D(s)]$ of the second-order receiver is defined in Equation 5 as follows:

$$\text{Magnitude}(V/I)=(Rf*s+2)/[s+2+(Rf*s)/(Rx*R2*C2)+Rf/(Rx*R1*R2*C1*C2)] \quad (5)$$

The transfer function $N(s)/D(s)$ of the third-order ambient light suppression circuit 203C is defined by Equation 6 as follows:

$$N(S)/D(s)=(R3*C3*s+1)/(R1*R2*R3*C1*C2*C3*s+3) \quad (6)$$

In this case, the transfer function $Rf*D(s)/[Rf/Rx*N(s)+D(s)]$ of the third-order receiver is defined in Equation 7 as follows:

$$\text{Magnitude}(V/I)=(Rf*s+3)/[s+3+(Rf*s)/(Rx*R1*R2*C1*C2)+Rf/(Rx*R1*R2*R3*C1*C2*C3)] \quad (7)$$

Figure 3:
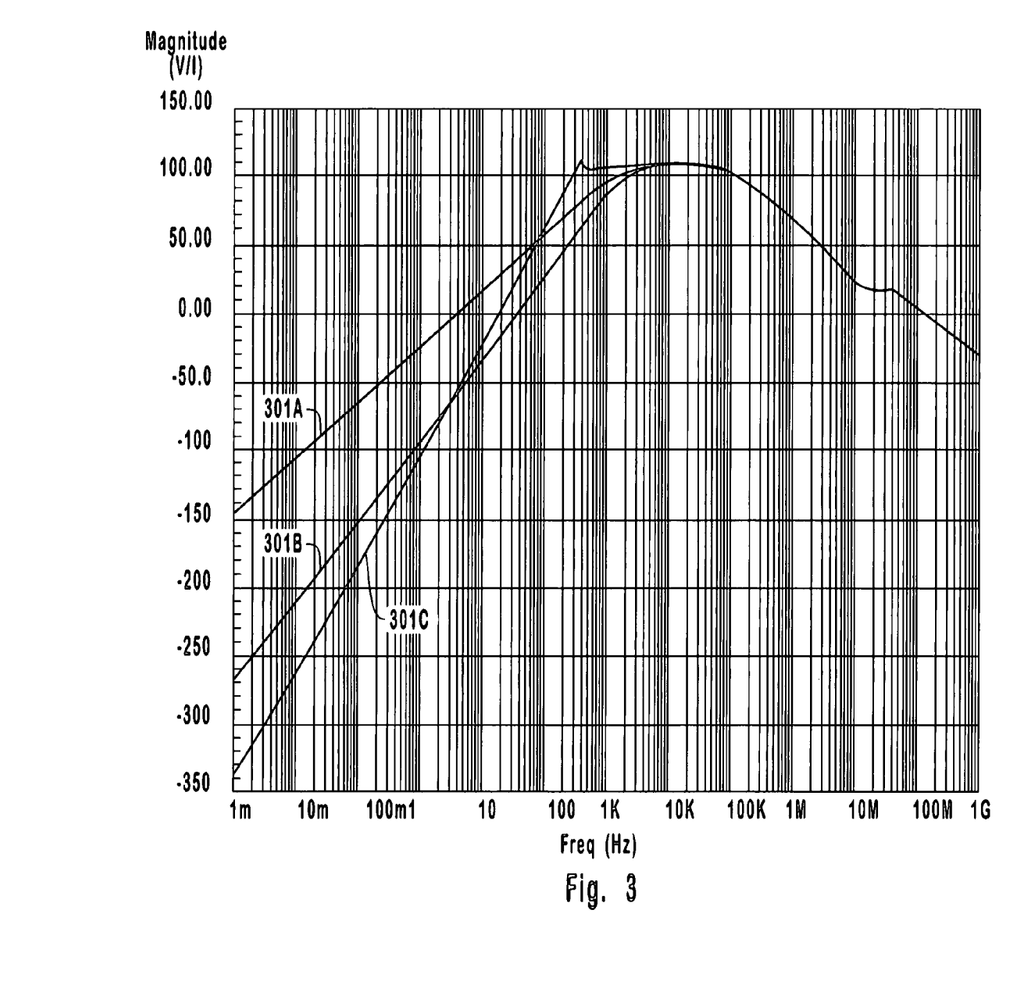
FIG. 3 is a frequency response diagram showing example frequency responses for each of the optical receiver circuits of FIGS. 2A through 2C.

FIG. 3 shows a comparative frequency response plot for the optical receiver circuit 100 in each of these three configurations. Lines 301A, 301B, and 301C in FIG. 3 represent the frequency response for the receivers of FIGS. 2A, 2B and 2C, respectfully. In each case, the resistor and capacitor values are chosen such that all zeros are at DC and such that all poles are at 2.5 kHz. However, there are many possible frequency responses by choosing different resistor and capacitor values. Note that the higher the order of the ambient light suppression circuit, the steeper the dropoff is below the cutoff frequency of 2.5 kHz, thereby allowing for more suppression of low frequency components.

A specific procedure for designing an optical receiver circuit having a desired high pass filter transfer function and the configuration of FIG. 1 will now be described. In this example, the second-order ambient light suppression circuit 203B of FIG. 2B will be taken as the structure of the ambient light suppression circuit. Similar design procedures apply to optical receiver circuits having ambient light suppression circuits of other orders.

The basic design procedure is to select a high pass filter of a certain order to thereby assign a target transfer function of the optical receiver circuit 100 of FIG. 1. Given the configuration of FIG. 1 and given the target transfer function, the transfer function $N(s)/D(s)$ of the ambient suppression circuit 103 is then solved. In this process, Rf is normalized to 1, with the ratio Rf/Rx adjusted per the circuit biasing requirements. The target transfer function is then equated to Equation 1, and then $N(s)$ and $D(s)$ are solved for.

First, a target transfer function for the optical receiver circuit 100 is selected. As previously mentioned, the optical receiver circuit 100 as a whole should behave as a high-pass filter so that unwanted ambient light current components are suppressed without significantly attenuating the modulated current caused by the reflected modulated light. A high pass filter whose frequency response is known is then selected. For example, the frequency response of the optical receiver circuit as a whole may selected to be a high pass Butterworth filter. A Butterworth filter is a good selection because it is maximally flat in the pass band and has known stability. However, other high-pass filters could be just as easily chosen. Since the optical receiver circuit is a second-order receiver, the transfer function of a second-order Butterworth filter is presented below in Equation 8.

$$\text{Magnitude}(V/I)=(s+2)/[(s+2)+\text{sqrt}(2)*s+1] \quad (*8)$$

The transfer function of Equation 8 may then be equated to the transfer function of Equation 1 as shown in the following Equation 9.

$$(s+2)/(s+2)+\text{sqrt}(2)*s+1]=RF*D(s)/[Rf/Rx*N(s)+D(s)] \quad (9)$$

Rf is then normalized to 1, and the ratio Rf/Rx is set to 125/3 as per the requirements of the circuit. Solving for $N(s)$ and $D(s)$, $N(s)$ becomes $s+2$, and $D(s)$ becomes $(3/125)*(\text{sqrt}(2)*s+1)$. Comparing this to transfer function of the second-order ambient light suppression circuit 203B (see Equation (4)), if we let R1 equal R2 and set them both equal to 1, the resistor and capacitor values may be as follows:

$C1=\text{sqrt}(2)$ $C2=125/(3*\text{sqrt}(2))$ $R1=R2=1$

Figure 4:
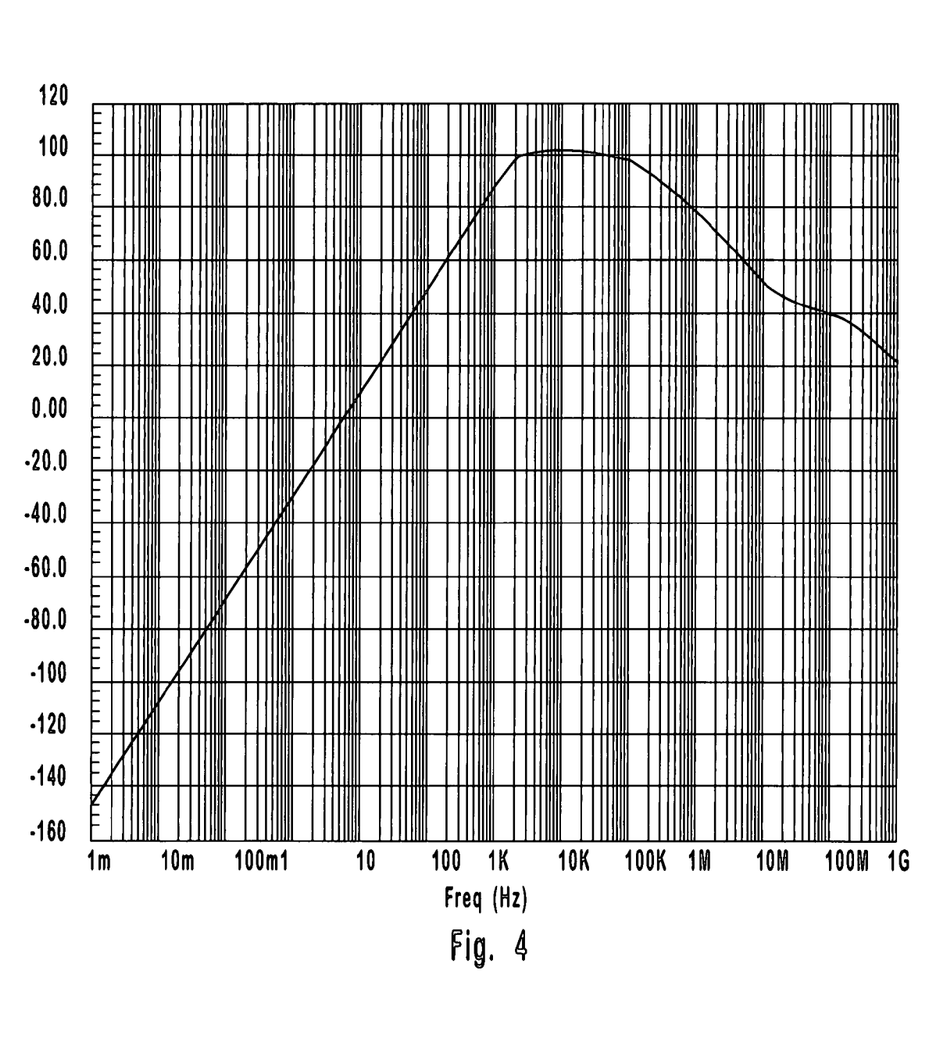
FIG. 4 is a frequency response diagram showing an example frequency response for an optical receiver circuit that is implemented as a second-order Butterworth filter.

Once the resistors and capacitor values are determined, their values are impedance and frequency scaled to get their final values. If Rf is equal to 125 k, we can then impedance scale by 125 k. For a 3 dB per decade frequency change spanning from 1 rad/sec to 2000 Hz, we frequency scale by 4000* pi. Accordingly, C1 obtains the value $\text{sqrt}(2)$ $(4000*\text{pi}*125k)=900$ pF. Likewise, C2 obtains the value $125/(3\text{sqrt}(2)*4000*\text{pi}*125k)=18.75$ nF FIG. 4 shows simulation results for this second-order Butterworth filter with poles set at 2000 Hz.

Figure 5:
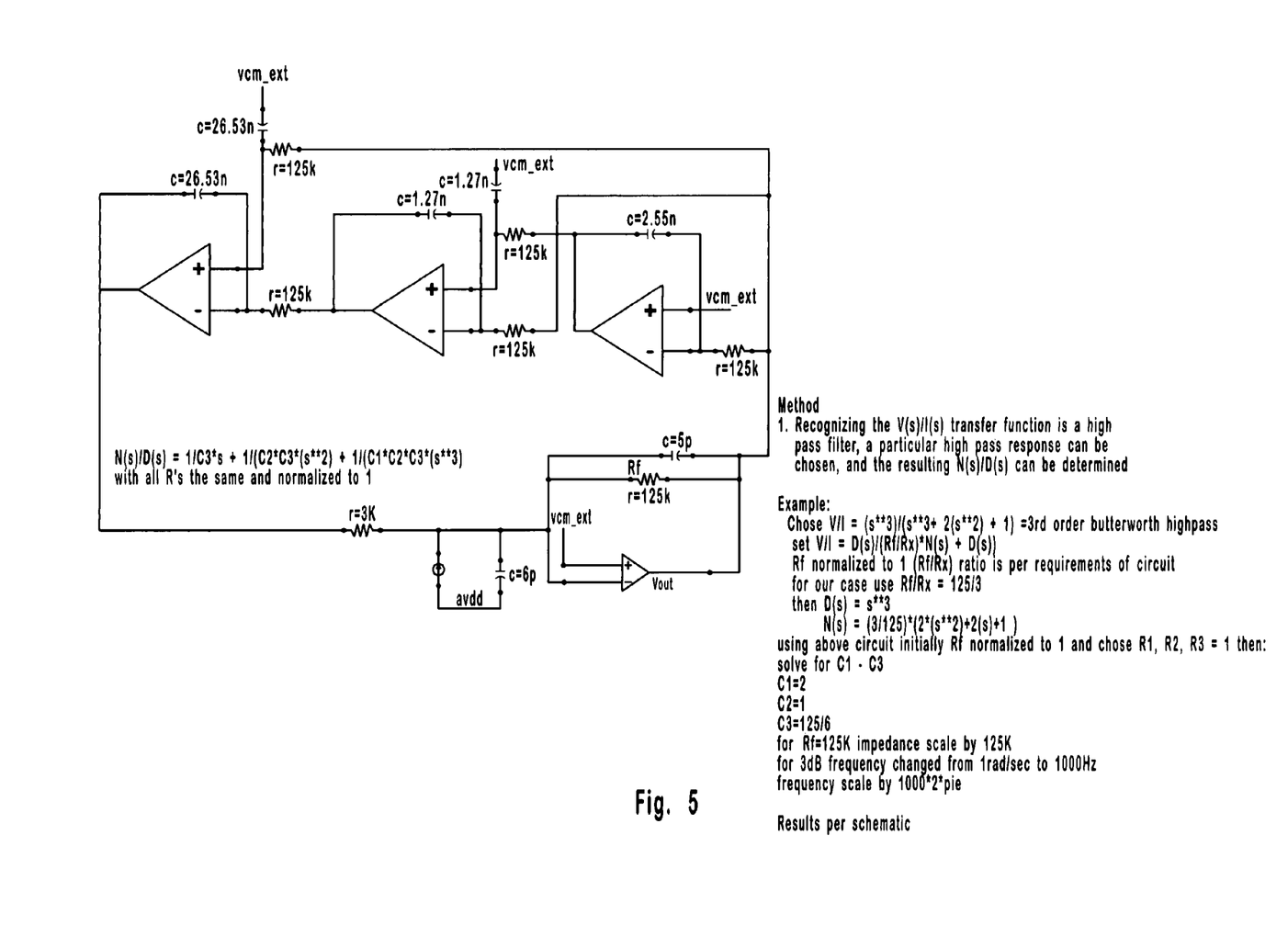
FIG. 5 illustrates a schematic of a third-order optical receiver circuit with an associated description of a design process associated with assigning a third-order Butterworth filter transfer function to the optical receiver circuit as a whole.
Figure 6:
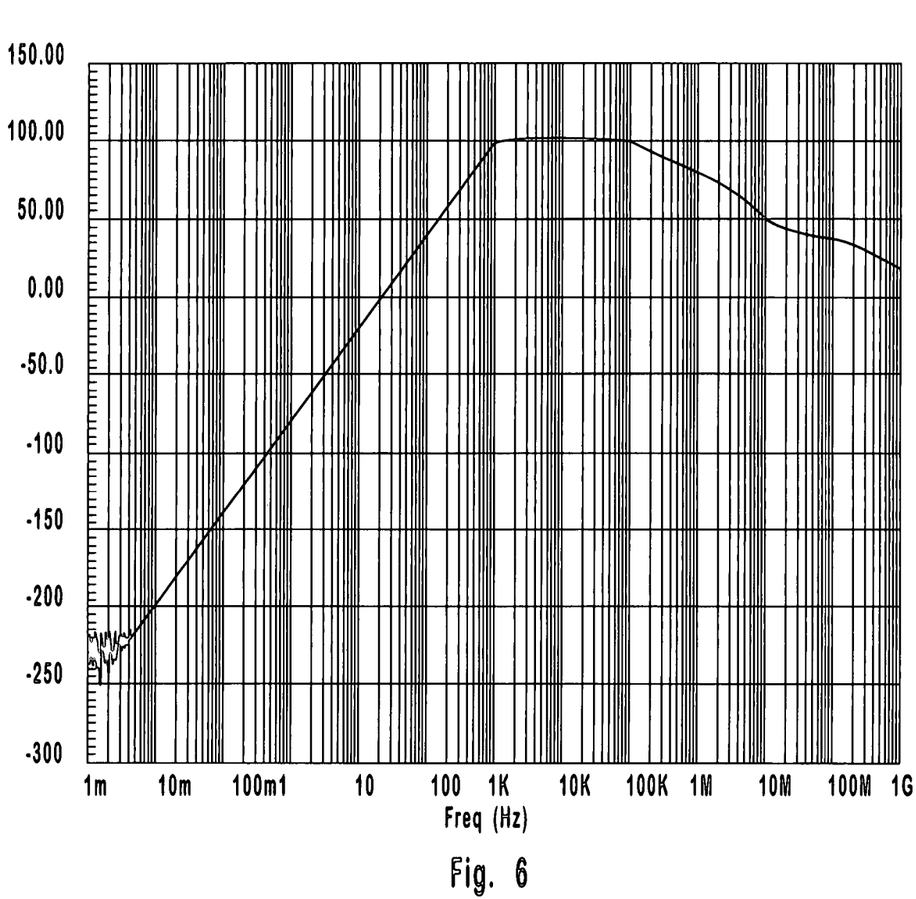
FIG. 6 illustrates a frequency response diagram of the optical receiver circuit shown and designed in FIG. 5.

The principles of the present invention are not limited to low-order filtration. For example, FIG. 5 illustrates a schematic digram of a third-order optical receiver circuit that performs third-order Butterworth filtration. FIG. 5 also includes a summary description of how the capacitor and resistor values are obtained. The process is similar to that described above with respect to the second-order Butterworth filter of FIG. 4. FIG. 6 illustrates a corresponding frequency response diagram for the third-order optical receiver circuit.

Figure 7:
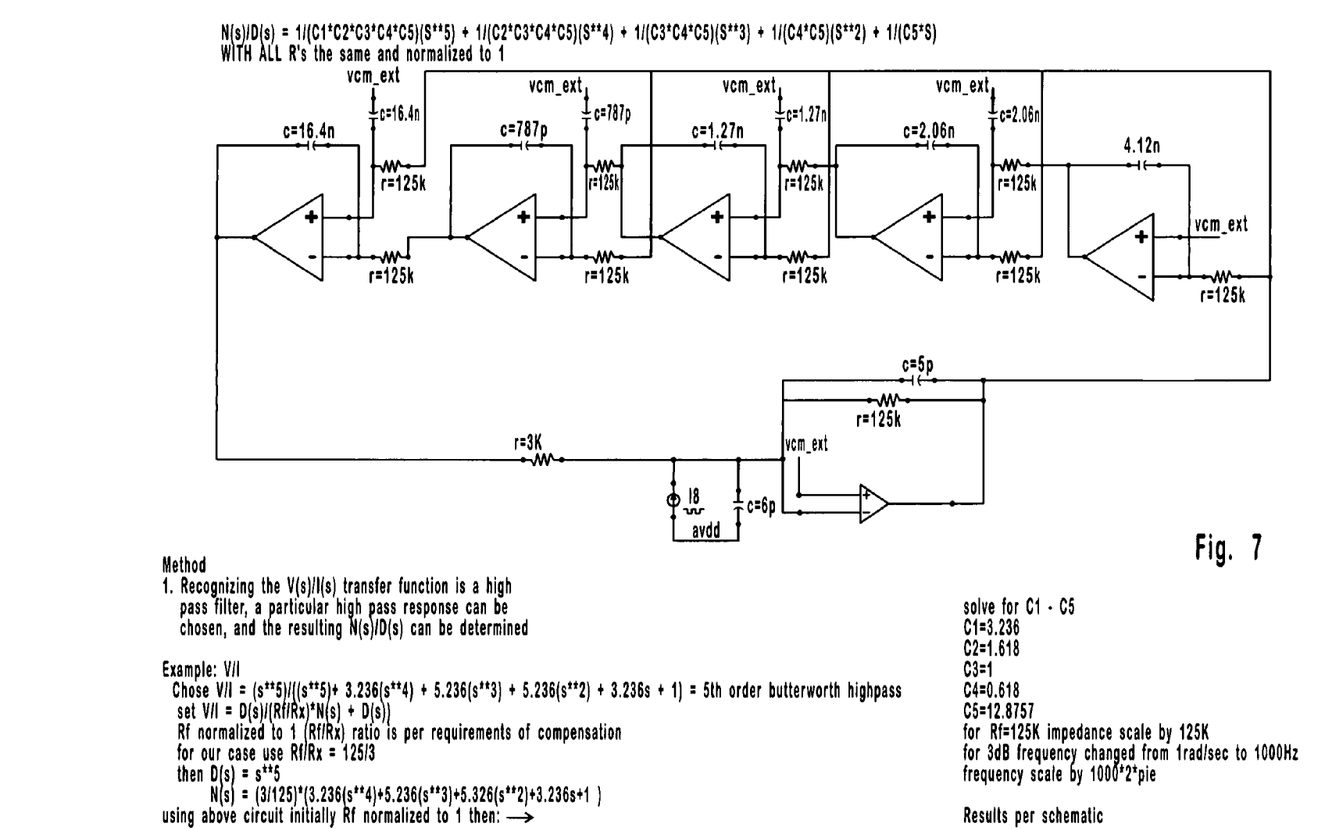
FIG. 7 illustrates a schematic of a fifth-order optical receiver circuit with an associated description of a design process associated with assigning a fifth-order Butterworth filter transfer function to the optical receiver circuit as a whole.
Figure 8:
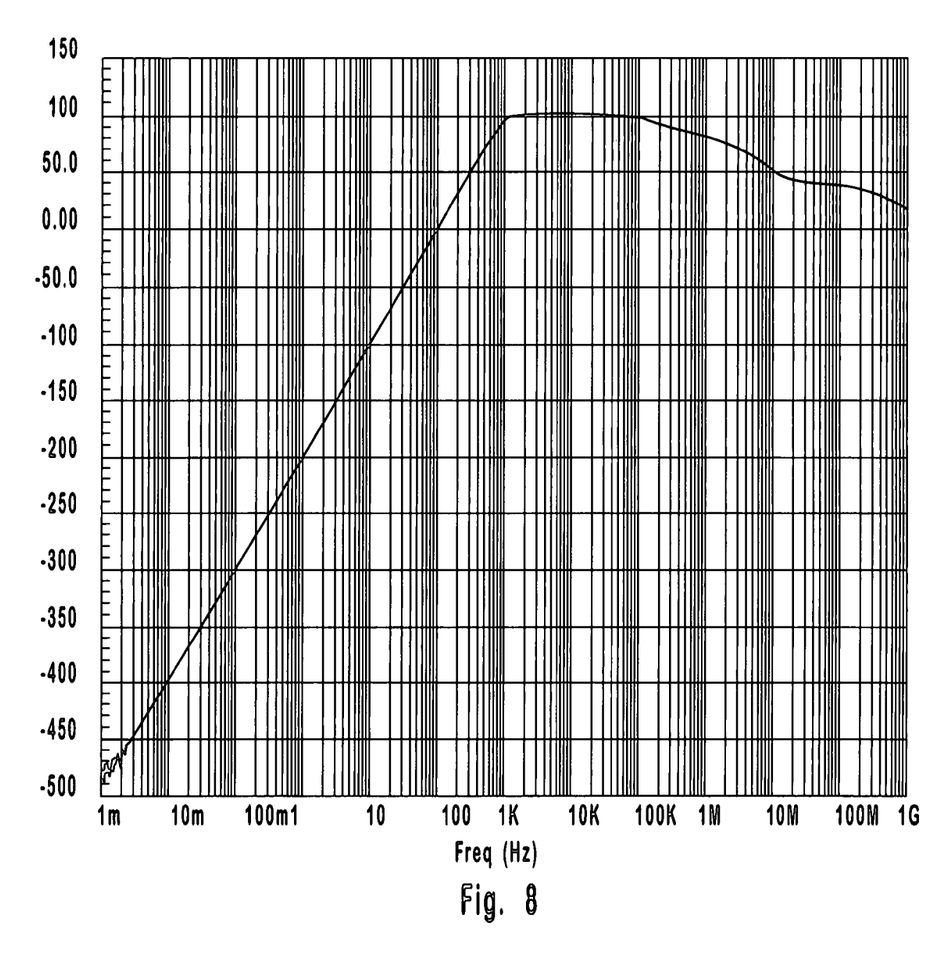
FIG. 8 illustrates a frequency response diagram of the optical receiver circuit shown and designed in FIG. 7.

FIG. 7 illustrates a schematic diagram of a fifth-order optical transceiver circuit that performs fifth-order Butterworth filtration. Likewise, FIG. 7 also includes a summary description of how the various capacitor and resistor values are obtained. FIG. 8 illustrates a corresponding frequency response diagram for the fifth-order optical receiver circuit.

In general, for the higher order Butterworth filters, the $N(s)/D(s)$ function is of the form $A/s+B/(s+2)+C/(s+3)+...$. The circuit realization of this ambient light suppression function can be a series connection of inverting and non-inverting integrator circuits, but is not limited to this realization.

Figure 9:
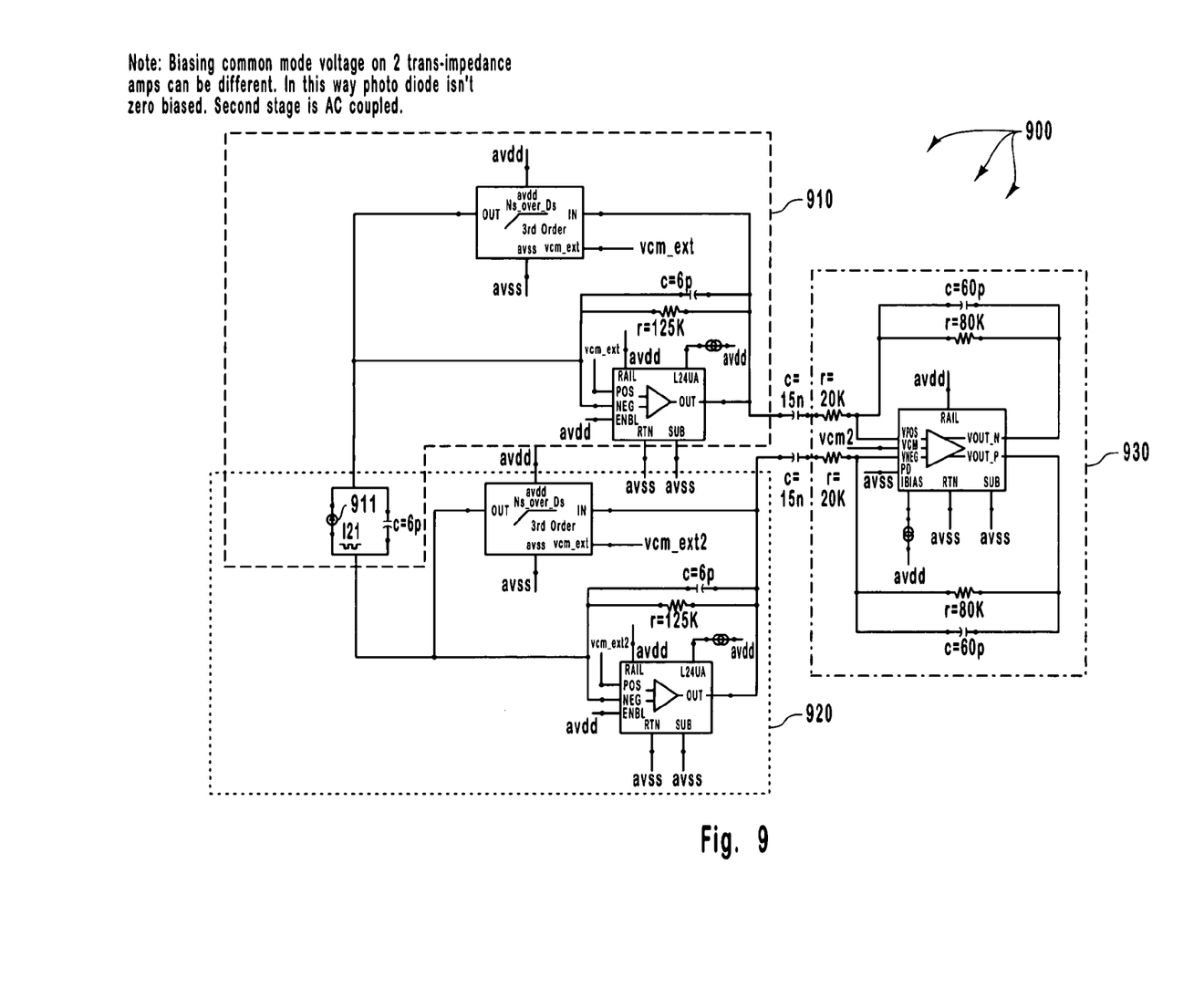
FIG. 9 illustrates a schematic of a differential optical receiver circuit that operates according to the principles of the present invention.

The circuit is not limited to being a single ended implementation. FIG. 9 shows a differential version 900 of an optical receiver circuit. The different optical receiver circuit 900 includes a positive optical receiver circuit 910 represented by the circuit within the dashed box, a negative optical receiver circuit 920 represented by the circuit within the dotted box, and a second stage circuit 930 represented by the circuit within the intermittent dotted/dashed box.

The photodiode is represented by a current source 911, which is shared by both the position and negative optical receiver circuits 910 and 920. The photodiode 911 draws current from one of the input terminals (e.g., the negative input terminal) of the trans-impedance amplifier in the negative optical receiver circuit 920, while supplying current to one of the input terminals (e.g., the negative input terminal) of the trans-impedance amplifier in the position optical receiver circuit. The trans-impedance amplifier positive nodes of the positive and negative optical receiver circuits 910 and 920 may be referenced to either the same common mode voltage or to different voltages as shown in the schematic. In this way, the photodiode 911 can either be zero biased or biased to a desired voltage difference.

Figure 10:
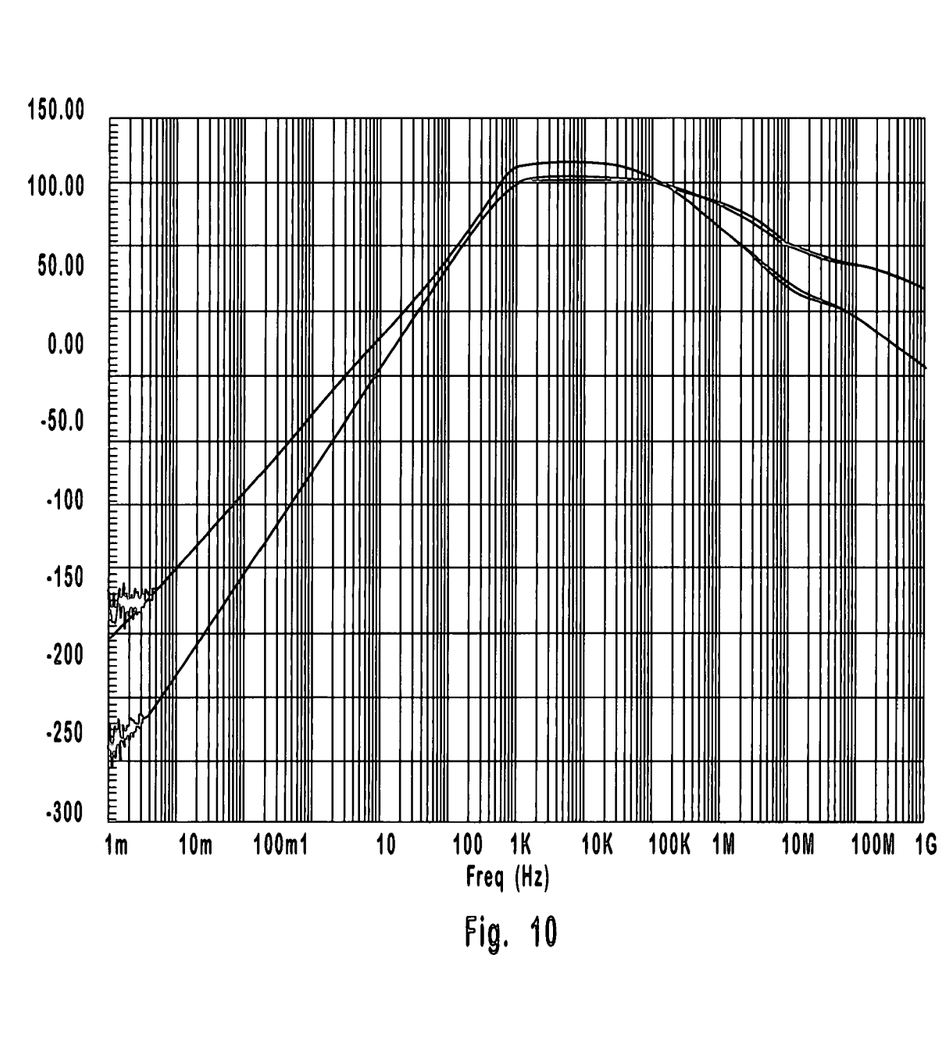
FIG. 10 illustrates a frequency response diagram of the differential optical receiver circuit shown in FIG. 9.

The output terminal of the positive optical receiver circuit 910 is coupled through a capacitor to an input terminal (e.g., a positive input terminal) of the second stage amplifier 930. The output terminal of the negative optical receiver circuit 920 is coupled through another capacitor to another input terminal (e.g., a negative input terminal) of the second stage amplifier 930. The AC coupling of the optical receiver circuits 910 and 920 to the second stage amplifier 930 eliminates much of the common mode difference. In addition, the second stage 930 can be used to perform additional filtering. A frequency response to the differential optical receiver circuit 900 is illustrated in FIG. 10.

Referring back to FIG. 1, the transfer function of the optical receiver circuit 100 will be the selected transfer function provided that the parasitics of the circuit are small compared to the selected resistances and capacitances for the circuit. The stability of the receiver will be the same as the stability of the selected transfer function. For standard transfer functions such as those known for the Butterworth filter, the response is well understood. The advantage of this methodology is that it not only provides ambient light suppression, but it also produces a stable receive when a stable filter transfer function is selected for the optical receiver circuit.

Circuits developed using this method filter out both the DC components of ambient light, as well as low frequency AC light variations since the optical receiver circuit may be realized as a high-pass filter. The optical receiver circuit may be a first-order high pass filter, although this need not be the case. Higher-order high pass filters of the type described herein filter out a larger range of low frequency components given a certain cutoff frequency compared to the first-order high pass filter. The methods described above may be used to design the ambient light suppression circuit 103 to have a transfer function that enables the optical receiver circuit to behave as a high-pass filter of any order.

For applications in which the optical light is modulated using frequencies in the audio range, single pole systems can in many cases only filter DC. As an example if the trans-impedance amp gain is 100 dB and the pole freq must be 1 Khz, then a single pole system (20 dB/dec) high pass filter will cross zero dB in 5 decades. This means ambient light attenuation would start at 0.1 Hz (5 decades from 1 Khz) or essentially DC. If a third-order filter is used (60 dB/dec), then ambient light attenuation will occur in less than 2 decades that is between 10 and 100 Hz. This is sufficient for many applications.

The mechanism described herein also produces a result at the output of the trans-impedance amplifier which is very well defined. The combined ambient light suppression circuit and trans-impedance amplifier can be made to realize an exact filter function. In doing this, the ambient light rejection can be set exactly. The stability strengths or weaknesses associated with a resulting design are the same as the stability strengths or weaknesses associated with target filter transfer function selected for the optical receiver circuit in the design process described above. For standard transfer functions such as the Butterworth filter, the stability issues are well understood.

The higher order filter circuits (such as that illustrated in FIG. 7) in general have more circuitry, which produce low frequency noise. However, the higher order filter rejects this noise, especially the low frequency noise. The resulting circuits have good noise performance.

The circuitry discussed can be realized with standard components (e.g., operational amplifiers) and passive components can be used to set the actual pole frequencies. Both discrete and ASIC solutions are possible. In addition, the circuit can be realized in either single ended or differential configurations.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An optical receiver circuit comprising the following:
    a photodiode configured to generate a current when exposed to light, the photodiode having an anode terminal and a cathode terminal;
    a first trans-impedance amplifier having an input terminal coupled to one of the cathode or the anode terminal of the photodiode, the first transimpedance amplifier further having an output terminal;
    a first ambient light suppression circuit in a first feedback loop between the output terminal of the first trans-impedance amplifier and the input terminal of the first trans-impedance amplifier;
    a second trans-impedance amplifier having an input terminal coupled to the other of the cathode or the anode terminal of the photodiode, the second transimpedance amplifier further having an output terminal; and
    a second ambient light suppression circuit in a second feedback loop between the output terminal of the second trans-impedance amplifier and the input terminal of the second trans-impedance amplifier.

2. The optical receiver circuit as recited in claim 1, wherein the first ambient light suppression circuit comprises an integrating amplifier.

3. The optical receiver circuit in accordance with claim 1, further comprising the following:
    a second stage amplifier that has a first input terminal coupled through a first capacitor to the output terminal of the first trans-impedance amplifier, and a second input terminal coupled through a second capacitor to the output terminal of the second trans-impedance amplifier.

4. The optical receiver circuit as recited in claim 1, wherein the ambient light suppression circuit comprises a non-inverted integrating amplifier.

5. The optical receiver circuit as recited in claim 1, wherein the input terminal of the first trans-impedance amplifier is coupled to the cathode terminal of the photodiode.

6. The optical receiver circuit as recited in claim 5, wherein the first ambient light suppression circuit comprises an inverted integrating amplifier.

7. The optical receiver circuit as recited in claim 1, wherein the first ambient light suppression circuit comprises a filter of second-order or higher.

8. The optical receiver circuit as recited in claim 7, wherein a transfer function of the first ambient light suppression circuit is selected such that the optical receiver circuit operates as a Butterworth filter of second-order or higher.

9. The optical receiver circuit as recited in claim 1, wherein the first ambient light suppression circuit comprises a filter of third-order or higher.

10. The optical receiver circuit as recited in claim 9, wherein a transfer function of the first ambient light suppression circuit is selected such that the optical receiver circuit operates as a Butterworth filer of third-order or higher.

11. The optical receiver circuit as recited in claim 1, wherein the first ambient light suppression circuit comprises a filter of fifth-order or higher.

12. The optical receiver circuit as recited in claim 11, wherein a transfer function of the first ambient light suppression circuit is selected such that the optical receiver circuit operates as a Butterworth filter of fifth-order or higher.

13. The optical receiver circuit as recited in claim 1, wherein the first ambient light suppression circuit is configured to have a frequency response such that the optical receiver circuit is a high-pass filter.

14. The optical receiver circuit as recited in claim 13, wherein the high-pass filter is a second-order or higher high-pass filter.

15. The optical receiver circuit as recited in claim 14, wherein the high-pass filter is a third-order or higher high-pass filter.

16. The optical receiver circuit as recited in claim 15, wherein the high-pass filter is a fifth-order or higher high-pass filter.

* * * * *